(12) United States Patent
Jang et al.

(10) Patent No.: US 10,957,877 B2
(45) Date of Patent: Mar. 23, 2021

(54) ORGANIC LIGHT EMITTING DIODE DISPLAY

(71) Applicant: LG Display Co., Ltd., Seoul (KR)

(72) Inventors: Ji-Hyang Jang, Paju-si (KR); So-Young Jo, Paju-si (KR); Won-Hoe Koo, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/212,484

(22) Filed: Dec. 6, 2018

(65) Prior Publication Data

US 2019/0189966 A1 Jun. 20, 2019

(30) Foreign Application Priority Data

Dec. 19, 2017 (KR) ........................ 10-2017-0175467

(51) Int. Cl.
*H01L 51/52* (2006.01)
*H01L 27/32* (2006.01)

(52) U.S. Cl.
CPC ...... *H01L 51/5268* (2013.01); *H01L 51/5209* (2013.01); *H01L 51/5225* (2013.01); *H01L 51/5275* (2013.01); *H01L 27/322* (2013.01); *H01L 27/3244* (2013.01); *H01L 51/5253* (2013.01)

(58) Field of Classification Search
None
See application file for complete search history.

(56) References Cited

U.S. PATENT DOCUMENTS

| 8,710,527 B2 | 4/2014 | Moon et al. |
| 8,872,206 B2 | 10/2014 | Chung et al. |
| 9,172,060 B2 | 10/2015 | Moon et al. |
| 9,614,162 B2 | 4/2017 | Liping et al. |
| 10,347,871 B2 | 7/2019 | Joung et al. |

(Continued)

FOREIGN PATENT DOCUMENTS

| CN | 1784093 A | 6/2006 |
| CN | 102931208 A | 2/2013 |

(Continued)

OTHER PUBLICATIONS

Taiwan Intellectual Property Office, Office Action, TW Patent Application No. 107142774, dated Oct. 15, 2019, six pages (with concise explanation of relevance).

(Continued)

*Primary Examiner* — Benjamin P Sandvik
(74) *Attorney, Agent, or Firm* — Fenwick & West LLP

(57) ABSTRACT

An organic light emitting diode display device includes: a substrate including a plurality of pixel regions which each include an emission region and a non-emission region around the emission region; a plurality of scattering portions disposed on the substrate, corresponding to the emission region, and spaced apart from each other; a first overcoat layer disposed on the substrate having the plurality of scattering portions and including a plurality of concave portions which respectively correspond to the plurality of scattering portions; a first electrode disposed on the first overcoat layer in each of the plurality of pixel regions; and an organic light emitting layer and a second electrode sequentially disposed on the first electrode.

13 Claims, 4 Drawing Sheets

(56) References Cited

U.S. PATENT DOCUMENTS

| | | |
|---|---|---|
| 2006/0113898 A1 | 6/2006 | Toyoda |
| 2012/0256218 A1 | 10/2012 | Kwack et al. |
| 2012/0313099 A1 | 12/2012 | Chung et al. |
| 2013/0037828 A1 | 2/2013 | Moon et al. |
| 2014/0167014 A1 | 6/2014 | Liping et al. |
| 2014/0199797 A1 | 7/2014 | Moon et al. |
| 2015/0380466 A1* | 12/2015 | Koo ............... H01L 27/3258 257/40 |
| 2016/0268358 A1* | 9/2016 | Ito .................. H01L 51/5218 |
| 2017/0062770 A1* | 3/2017 | Jang ............... H01L 51/5271 |
| 2017/0084875 A1 | 3/2017 | Joung et al. |
| 2017/0155094 A1 | 6/2017 | Joung et al. |
| 2019/0006626 A1* | 1/2019 | Kim ................. H01L 27/322 |
| 2019/0165323 A1* | 5/2019 | Jo .................. H01L 51/5225 |
| 2019/0280247 A1 | 9/2019 | Joung et al. |

FOREIGN PATENT DOCUMENTS

| | | |
|---|---|---|
| CN | 104617227 A | 5/2015 |
| CN | 107039598 A | 8/2017 |
| JP | 2015-118761 A | 6/2015 |
| JP | 2017-103231 A | 6/2017 |
| TW | 201251003 A | 12/2012 |
| TW | 201434660 A | 9/2014 |
| TW | 201517328 A | 5/2015 |

OTHER PUBLICATIONS

Intellectual Property India, Examination Report, IN Patent Application No. 201814047673, dated Jun. 25, 2020, six pages.

China National Intellectual Property Administration, Office Action, CN Patent Application No. 201811547558.6, dated Dec. 24, 2020, 12 pages.

* cited by examiner

ORGANIC LIGHT EMITTING DIODE DISPLAY

CROSS-REFERENCE TO RELATED APPLICATIONS

The present application claims priority to Republic of Korea Patent Application No. 10-2017-0175467 filed in the Republic of Korea on Dec. 19, 2017, which is hereby incorporated by reference in its entirety.

BACKGROUND

Field of the Technology

The present disclosure relates to an organic light emitting diode display device, and more particularly, to an organic light emitting diode display device having an improved light extraction efficiency.

Discussion of the Related Art

Recently, with the advent of an information-oriented society, as interest in information displays for processing and displaying a massive amount of information and demand for portable information media have increased, a display field has rapidly advanced. Thus, various light and thin flat panel display devices have been developed and highlighted.

As examples of the flat display devices, there are a liquid crystal display (LCD) device, a plasma display panel (PDP) device, a field emission display (FED) device, an electroluminescence display (ELD) device, an organic light emitting diode (OLED) display device, and the like. The flat display devices exhibit excellent characteristics in terms of thinning, lightening, and reductions in the power consumption thereof and thus have rapidly replaced the conventional cathode ray tube (CRT) displays.

Among the flat panel display devices, the OLED display device is a self-luminescent type device and does not require a backlight unit as used in the LCD device which is not a non-self luminescent type device. As a result, the OLED display device has light weight and a thin profile.

In addition, the OLED display device has advantages in viewing angle, contrast ratio, and power consumption as compared with the LCD device. Furthermore, the OLED display device may be driven with a low direct current (DC) voltage and has rapid response speed. Moreover, since inner elements of the OLED display device have a solid phase, the OLED display device has high durability against external impact and has a wide available temperature range.

Specifically, since the OLED display device is manufactured through a simple process, manufacturing costs may be reduced as compared with the conventional LCD device.

The OLED display device is a self-luminescent type device emitting light through a light emitting diode (LED). The LED emits light through an organic electroluminescence phenomenon.

FIG. 1 is a band diagram illustrating an LED having an emission principle based on an organic electroluminescence phenomenon.

As shown, an LED 10 includes an anode 21, a cathode 25, and an organic light emitting layer disposed between the anode 21 and the cathode 25. The organic light emitting layer includes a hole transport layer (HTL) 33, an electron transport layer (ETL) 35, and an emitting material layer (EML) 40 interposed between the HTL 33 and the ETL 35.

In order to improve luminous efficiency, a hole injection layer (HIL) 37 is interposed between the anode 21 and the HTL 33, and an electron injection layer (EIL) 39 is interposed between the cathode 25 and the ETL 35.

In the LED 10, when positive and negative voltages are respectively applied to the anode 21 and the cathode 25, holes of the anode 21 and electrons of the cathode 25 are transported to the EML 40 to form excitons. When the excitons transit from an excited state to a ground state, light is generated and emitted in the form of visible light by the EML 40.

However, in an OLED display device including the LED 10, while light emitted from the organic light emitting layer passes through various components and is emitted to the outside, a large portion of the light is lost. Thus, light emitted to the outside of the OLED display device is only about 20% of the light emitted from the organic light emitting layer.

Since an amount of the light emitted from the organic light emitting layer is increased in accordance with an amount of a current applied to the OLED display device, it is possible to further increase brightness of the OLED display device by applying more currents to the organic light emitting layer. However, in this case, power consumption is increased, and lifetime of the OLED display device is also reduced.

Therefore, there is a need for various research to improve the light extraction efficiency of the OLED display device.

SUMMARY

Accordingly, the present disclosure is directed to an organic light emitting diode (OLED) display device that substantially obviates one or more of the problems due to limitations and disadvantages of the related art.

An object of the present disclosure is to provide an OLED display device that can improve a light extraction efficiency.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, an organic light emitting diode display device includes: a substrate including a plurality of pixel regions which each include an emission region and a non-emission region around the emission region; a plurality of scattering portions disposed on the substrate, corresponding to the emission region, and spaced apart from each other; a first overcoat layer disposed on the substrate having the plurality of scattering portions, and including a plurality of concave portions which respectively correspond to the plurality of scattering portions; a first electrode disposed on the first overcoat layer in each of the plurality of pixel regions; and an organic light emitting layer and a second electrode sequentially disposed on the first electrode.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

DETAILED DESCRIPTION

Reference will now be made in detail to exemplary embodiments, examples of which are illustrated in the accompanying drawings. The same reference numbers may be used throughout the drawings to refer to the same or like parts.

Figure 1:
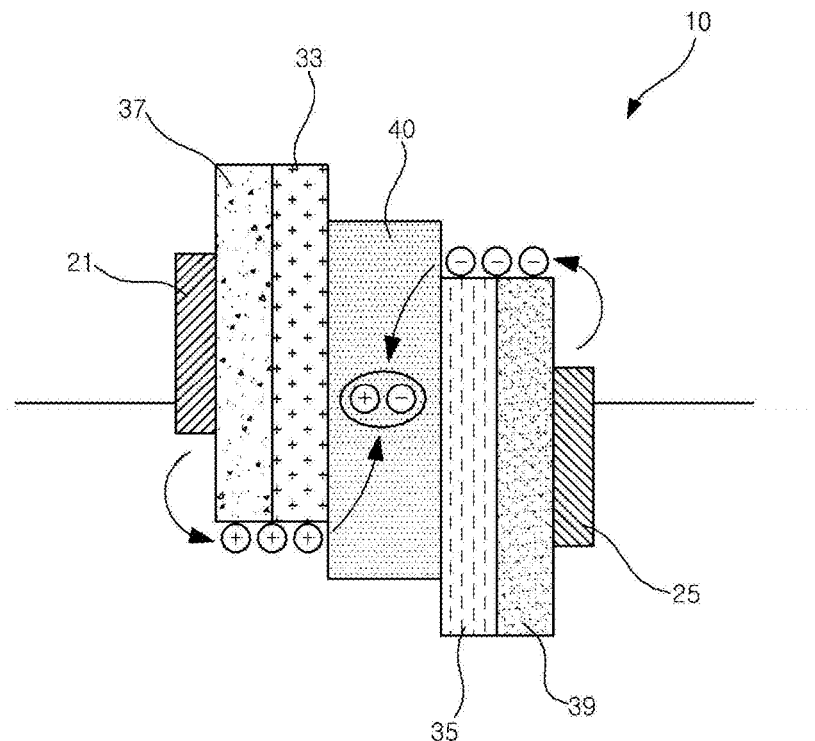
FIG. 1 is a band diagram illustrating a light emitting diode (LED) having an emission principle based on an organic electroluminescence phenomenon.
Figure 2:
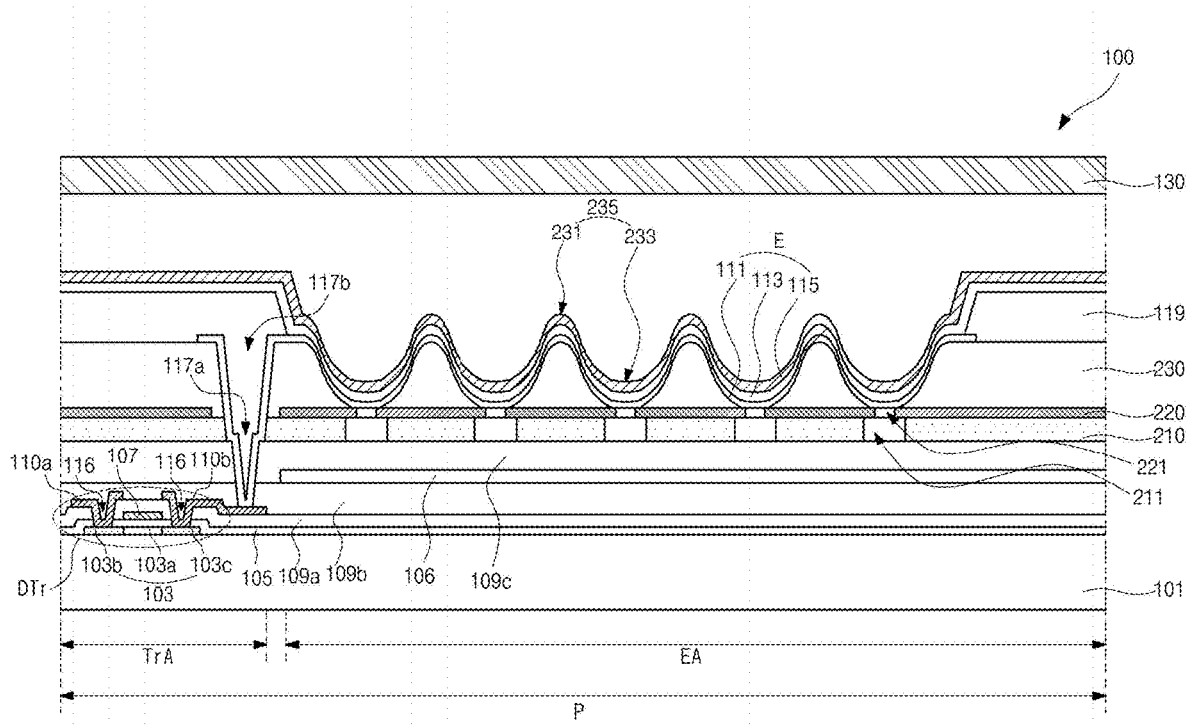
FIG. 2 is a schematic cross-sectional view illustrating an organic light emitting diode (OLED) display device according to a first embodiment of the present disclosure.
Figure 3:
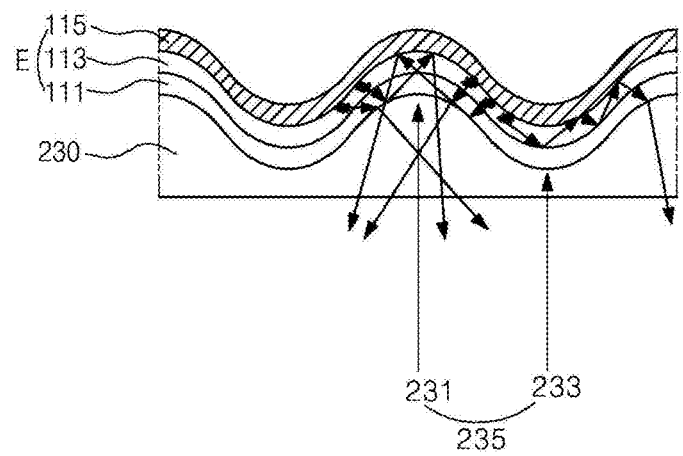
FIG. 3 is a schematic view illustrating a state in which light is guided in a concave portion of a microlens.

FIG. 2 is a schematic cross-sectional view illustrating an organic light emitting diode (OLED) display according to a first embodiment of the present disclosure, and FIG. 3 is a schematic view illustrating a state in which light is guided in a concave portion of a microlens.

An OLED display device 100 according to a first embodiment of the present disclosure may be categorized into a top emission type or a bottom emission type according to a transmission direction of emitted light. The bottom emission type is described by way of example in this embodiment.

Each pixel region P may be defined to include an emission region EA in which a light emitting diode (LED) E is provided to substantially display an image, and a non-emission region around (or surrounding) the emission region EA. The non-emission region may include a switching region TrA, which is disposed along an edge of the emission region EA, and in which a driving thin film transistor DTr is formed.

As shown, in the OLED display device 100 according to the first embodiment of the present disclosure, a substrate 101, on which the driving thin film transistor DTr and the LED E are formed, is encapsulated by a protective film 130.

In more detail, a semiconductor layer 103 is disposed in the switching region TrA of each pixel region P on the substrate 101. The semiconductor layer 103 is made of silicon and includes an active region 103A as a channel disposed at a central portion. The semiconductor layer 103 also includes a source region 103b and a drain region 103c, which are doped with high concentration impurities and are disposed on both sides of the active region 103a.

A gate insulating layer 105 is disposed on an upper surface of the semiconductor layer 103.

A gate electrode 107 and a gate line (not shown), which extends in one direction, are provided on the gate insulating layer 105 so as to correspond to the active region 103a of the semiconductor layer 103.

In addition, a first interlayer insulating layer 109a is disposed on the gate electrode 107 and the gate line. In this case, the first interlayer insulating layer 109a and the gate insulating layer 105 have first and second semiconductor layer contact holes 116 to respectively expose the source region 103b and drain region and 103c.

Next, a source electrode 110a and a drain electrode 110b are spaced apart from each other on the first interlayer insulating layer 109a and are respectively in contact with the source region 103b and drain region 103c through the first and second semiconductor layer contact holes 116.

A second interlayer insulating layer 109b is disposed on the first interlayer insulating layer 109a and the source and drain electrodes 110a and 110b.

In this case, the driving thin film transistor DTr comprises the source electrode 110a, drain electrode 110b, the semiconductor layer 103, the gate insulating layer 105, and the gate electrode 107 the driving thin film transistor DTr.

Although not shown in the drawings, data lines are provided to cross the gate lines to define the pixel regions P. A switching thin film transistor (not shown) may have the same structure as the driving thin film transistor DTr and is connected to the driving thin film transistor DTr.

In this embodiment, the driving thin film transistor DTr having a top gate structure with the semiconductor layer 103 formed as a polycrystalline silicon layer or oxide semiconductor layer is described by way of example. Alternatively, the driving thin film transistor DTr may have a bottom gate structure with the semiconductor layer 103 formed as an amorphous silicon layer.

The substrate 101 may be made of a glass material. Alternatively, the substrate 101 may be made of a transparent plastic material such as a polyimide material, which is bendable or flexible. Polyimide having a high heat resistance may be preferred, considering that a high temperature deposition process is performed for the substrate 101. An entire surface of the substrate 101 may be covered with at least one buffer layer (not shown).

The driving thin film transistor DTr in the switching region TrA may have a characteristic in which a threshold voltage thereof is shifted by light. To prevent this, the OLED display device 100 according to the present application may further include a light shielding layer (not shown) provided below the semiconductor layer 103.

The light shielding layer (not shown) is provided between the substrate 101 and the semiconductor layer 103 to block light incident on the semiconductor layer 103 through the substrate 101 and to minimize or prevent a change in a threshold voltage of a transistor caused by external light. The light shielding layer (not shown) may be covered with the buffer layer (not shown).

A wavelength conversion layer 106 is disposed on the second interlayer insulating layer 109b corresponding to the emission region EA of each pixel region P.

The wavelength conversion layer 106 includes a color filter which transmits a wavelength of a color set (or defined) at the pixel region P among white light emitted to the substrate 101 from the LED E.

In an example, the wavelength conversion layer 106 may transmit a red, green, or blue wavelength. For example, in the OLED display device 100 according to the present application, each unit pixel may include adjacent first to third pixel regions P. In this case, the wavelength conversion layer 106 provided in the first pixel region may include a red color filter, the wavelength conversion layer 106 provided in the second pixel region may include a green color filter, and the wavelength conversion layer 106 provided in the third pixel region may include a blue color filter.

Additionally, in the OLED display device 100 according to the present application, each unit pixel may further include a white pixel region in which the wavelength conversion layer 106 is not formed.

In another example, the wavelength conversion layer 106 may include quantum dots which have a size capable of emitting light with a color set at its pixel region P according to white light emitted to the substrate 101 from the LED E. The quantum dot may comprise a material selected from CdS, CdSe, CdTe, ZnS, ZnSe, GaAs, GaP, GaAs—P, Ga—Sb, InAs, InP, InSb, AlAs, AlP, or AlSb.

For example, the wavelength conversion layer 106 of the first pixel region may include quantum dots of CdSe or InP, the wavelength conversion layer 106 of the second pixel region may include quantum dots of CdZnSeS, and the wavelength conversion layer 106 of the third pixel region may include quantum dots of ZnSe. The OLED display device 100 with the wavelength conversion layer 106 having quantum dots can have a high color reproduction range.

In another example, the wavelength conversion layer 106 may include a color filter containing quantum dots.

A passivation layer 109c and a first overcoat layer 210 are sequentially disposed on the wavelength conversion layer 106. The passivation layer 109c, the first overcoat layer 210 and the second interlayer insulating layer 109b have a first drain contact hole 117a exposing the drain electrode 110b. A transparent electrode 220 is disposed on an upper surface of the first overcoat layer 210.

The transparent electrode 220 is made of a metal oxide such as indium tin oxide (ITO) or indium zinc oxide (IZO) and has a plurality of holes 221 which are spaced apart from each other by a predetermined distance.

A plurality of air holes 211 corresponding to the plurality of holes 221 are formed in the first overcoat layer 210.

A second overcoat layer 230 is disposed on the first overcoat layer 210 and the transparent electrode 220. The second overcoat layer 230 has a second drain contact hole 117b configured to communicate with the first drain contact hole 117a and expose the drain electrode 110a exposed through the first drain contact hole 117a. The transparent electrode 220 is covered by the second overcoat layer 230 and thus is not exposed in the second drain contact hole 117b.

In this case, a surface of the second overcoat layer 230 in the emission region EA may be configured such that a plurality of concave portions 233 and a plurality of convex portions 231 are alternately formed to constitute part of or an entirety of a microlenses 235. The convex portion 231 and the concave portion 233 may be defined based on a slope angle of the surface of the second overcoat layer 230. In this regard, a portion located over a point a slope angle of which is greatest may be the convex portion 231, and a portion located below the point of the greatest slope angle.

The OLED display device 100 according to the first embodiment of the present disclosure has more improved light extraction efficiency through the second overcoat layer 230, of which the surface is configured to comprise the microlenses 235.

In this case, the air holes 211 formed in the first overcoat layer 210 are positioned to correspond to the respective concave portions 233 of the second overcoat layer 230.

Therefore, in the OLED display device 100 according to the first embodiment of the present disclosure, through a configuration of the transparent electrode 220, the first overcoat layer 210, and the air holes 211, thereby improving light extraction efficiency, light, which is not extracted to the outside and is trapped in the LED E, may be extracted to the outside, thereby improving light extraction efficiency. This is described in more detail later.

The first and second overcoat layers 210 and 230 may be made of an insulating material having a refractive index of about 1.5. In this regard, the first and second overcoat layers 210 and 230 may be made of at least one selected from, for example, an acrylic-based resin, an epoxy resin, a phenol resin, a polyamide-based resin, a polyimide-based resin, an unsaturated polyester-based resin, a polyphenylene-based resin, a polyphenylene sulfide-based resin, benzocyclobutene, and photoresist.

A first electrode 111 is disposed on the second overcoat layer 230. The first electrode 111 is connected to the drain electrode 110b of the driving thin film transistor DTr, which is exposed through the first and second drain contact holes 117a and 117b, and may be made of, for example, a material having a relatively high work function to form an anode of the LED E.

The first electrode 111 may be made of a metal oxide material such as ITO or IZO, a mixture of a metal and an oxide material such as ZnO:Al and $SnO_2$:Sb, or a conductive polymer such as poly(3-methylthiophene), poly[3,4-(ethylene-1,2)-thiophene] (PEDT), polypyrrole and polyaniline. Alternatively, the first electrode 111 may be formed of a carbon nano tube (CNT), graphene, or a silver nano wire.

The first electrode 111 is disposed at each pixel region P, and a bank 119 may be disposed between the first electrodes 111 of the adjacent pixel regions P.

In other words, the bank 119 is disposed along an edge of each pixel region P. The first electrodes 111 are separate from each other with the bank 119 as a boundary portion of each pixel region.

The bank 119 may be made of a transparent insulating material having a refractive index of about 1.5. In this regard, the bank 119 may be made of at least one selected from, for example, an acrylic-based resin, an epoxy resin, a phenol resin, a polyamide-based resin, a polyimide-based resin, an unsaturated polyester-based resin, a polyphenylene-based resin, a polyphenylene sulfide-based resin, benzocyclobutene, and photoresist.

An organic light emitting layer 113 is disposed on the first electrode 111 and the bank 119. The organic light emitting layer 113 may be formed with a single layer made of an emitting material. In order to improve luminous efficiency, the organic light emitting layer 113 may be formed with multi layers of a hole injection layer, a hole transport layer, an emitting material layer, an electron transport layer, and an electron injection layer.

A second electrode 115 as a cathode is disposed entirely on the organic light emitting layer 113.

The second electrode 115 may be made of a material having a relatively low work function. The second electrode 115 may be formed with a single layer or multiple layers using a first metal such as Ag and a second metal such as Mg, and the single layer may be made of an alloy of the first and second metals at a predetermined ratio thereof.

In the OLED display device 100, when the first electrode 111 and the second electrode 115 are applied with respective voltages, a hole from the first electrode 111 and an electron from the second electrode 115 are transported to the organic light emitting layer 113 and form an exciton, and when a transition of the exciton from an excited state to a ground state happens, a light is produced and emitted.

In this case, the emitted light passes through the transparent first electrode 111 and is output to the outside so that the OLED display device 100 displays an image.

All of the first electrode 111, the organic light emitting layer 113, and the second electrode 115 sequentially disposed on the second overcoat layer 230 are formed along the concave portions 233 and the convex portions 231 formed at the surface of the second overcoat layer 230 to have a shape according to the shape of the second overcoat layer 230.

The protective film 130 in the form of a thin film is formed above the driving thin film transistor DTr and the LED E so that the OLED display device 100 is encapsulated by the protective film 130.

In order to prevent external oxygen and moisture from permeating into the OLED display device 100, the protective film 130 may include at least two stacked inorganic protective films. In this case, an organic protective film may be preferably interposed between the two neighboring inorganic protective films to compensate for impact resistance of the inorganic protective films.

In such the structure in which the organic protective film and the inorganic protective film alternately and repeatedly stacked, in order to prevent moisture and oxygen from permeating into side surfaces of the organic protective film, the inorganic protective films may completely cover the organic protective film.

Accordingly, the OLED display device 100 can prevent moisture and oxygen from permeating into the OLED display device 100 from the outside.

As described above, in the OLED display device 100 according to the first embodiment of the present disclosure, the microlenses 235 including the concave portions 233 and the convex portions 231 form the surface of the second overcoat layer 230, thereby improving light extraction efficiency.

In other words, among light emitted from the organic light emitting layer 113, light continuously totally internally reflected and trapped inside the organic light emitting layer 113 is extracted through multiple reflections by travelling at an angle smaller than a total reflection critical angle due to the microlenses 235 of the second overcoat layer 230, thereby improving external luminous efficiency. Therefore, light extraction efficiency of the OLED display device 100 is improved In particular, in the OLED display device 100 according to the first embodiment of the present disclosure, the first overcoat layer 210 having the plurality of air holes 211 and the transparent electrode 220 are disposed between the passivation layer 109c and the second overcoat layer 230, of which the surface is included as part of the microlenses 235, thereby further improving light extraction efficiency of the OLED display device 100.

More specifically, in the LED E, a light of an optical waveguide mode configured by a surface plasmon component produced at an interface between the organic light emitting layer 113 and metal layers, i.e., the first and second electrodes 111 and 115 may make up about 60% to about 70% of a total light produced in the organic light emitting layer 113.

In other words, 60% to 70% of the light produced in the organic light emitting layer 113 is trapped inside the LED E.

Therefore, in order to improve light extraction efficiency, as shown in FIG. 3, the surface of the second overcoat layer 230 is formed to have the microlenses 235, and thus external light extraction efficiency is improved. However, although the light extraction efficiency is improved through the microlenses 235, light emitted from the organic light emitting layer 113 still may not be output to the outside and may be trapped at the concave portions 233 of the microlenses 235.

The OLED display device 100 according to the first embodiment of the present disclosure extracts the light trapped inside the LED E to the outside through the air holes 211, thereby further improving light extraction efficiency.

Figure 4:
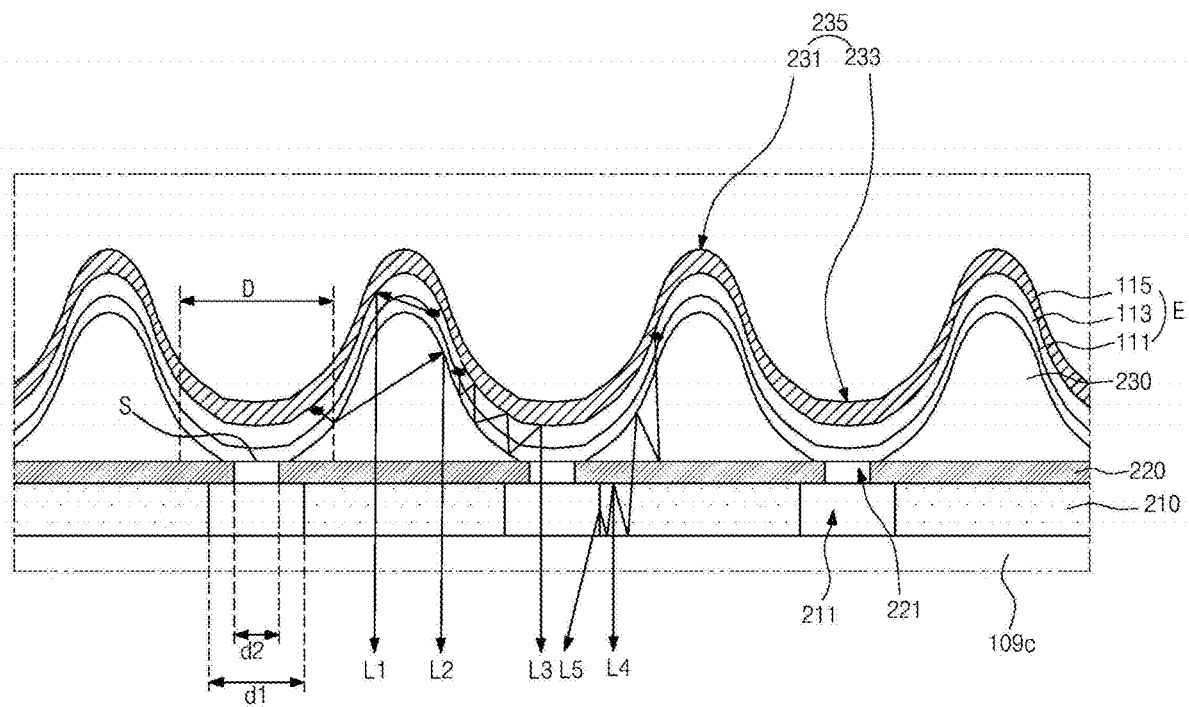
FIG. 4 is a schematic view illustrating a state in which light is guided in the OLED display device according to the first embodiment of the present disclosure.

FIG. 4 is a schematic view illustrating a state in which light is guided in the OLED display device according to the first embodiment of the present disclosure.

Referring to FIG. 4, the first overcoat layer 210 and the transparent electrode 220 are sequentially disposed on the passivation layer 109c corresponding to the emission region (EA of FIG. 2). The second overcoat layer 230 having the surface with the microlenses 235 is disposed on the transparent electrode 220. The LED E including the first electrode 111, the organic light emitting layer 113, and the second electrode 115 is disposed on the second overcoat layer 230.

All of the first electrode 111, the organic light emitting layer 113, and the second electrode 115 are sequentially formed to follow the surface of the second overcoat layer 230 configured with the microlenses 235 including the concave portions 233 and the convex portions 231.

The holes 221 corresponding to the concave portions 233 of the second overcoat layer 230 are formed in the transparent electrode 220. The air holes 211 of the transparent electrode 220 corresponding to the holes 221 are formed in the first overcoat layer 210.

A refractive index of the organic light emitting layer 113 may be substantially the same as a refractive index of the first electrode 111, and thus an optical path of light generated in the organic light emitting layer 113 may not change at an interface between the organic light emitting layer 113 and the first electrode 111.

The organic light emitting layer 113 and the first electrode 111 may have a refractive index of 1.8 to 2.0.

Since the first and second overcoat layers 210 and 230 have a refractive index of about 1.4 to about 1.6, while the light emitted in the organic light emitting layer 113 passes through the first electrode 111 and is extracted to the outside of the substrate 101, the light emitted in the organic light emitting layer 113 is totally internally reflected at an interface between the first electrode 111 and the second overcoat layer 230.

In this case, among the light totally internally reflected at the interface between the first electrode 111 and the second overcoat layer 230, some light L1 is extracted to the outside of the substrate 101, and some light has an angle greater than a total reflection critical angle and thus is not extracted to the outside of the substrate 101 and is trapped between the second overcoat layer 230 and the first electrode 111 or between the first electrode 111 and the second electrode 115.

In the OLED display device 100 according to the first embodiment of the present disclosure, since the second overcoat layer 230 has the microlenses 235, among light L2 and L3 totally internally reflected at the interface between the first electrode 111 and the second overcoat layer 230, the light L2 is extracted to the outside of the substrate 101 through multiple reflections by travelling at an angle smaller than a total reflection critical angle due to a curved shape of the convex portion 231 of the second overcoat layer 230.

Therefore, light extraction efficiency is improved.

Among the light L2 and L3 totally internally reflected at the interface between the first electrode 111 and the second overcoat layer 230, a light L3 travels to the concave portion 233 of the second overcoat layer 230. The light L3 travelling to the concave portion 233 of the second overcoat layer 230 is extracted to the outside of the substrate 101 through multiple reflections by travelling at an angle smaller than a total reflection critical angle through the hole 221 of the transparent electrode 220 and the air hole 211 of the first overcoat layer 210.

Therefore, since light extraction efficiency is improved even at the concave portion 233 of the microlens 235, light extraction efficiency of the OLED 100 is further improved, and light is also uniformly extracted to the outside.

Among light trapped by being totally reflected at the interface between the first electrode 111 and the second overcoat layer 230, some lights L4 and L5 intactly pass through the transparent electrode 220 having a refractive index greater than that of the second overcoat layer 230. The lights passing though the transparent electrode 220 are totally internally reflected again at an interface between the transparent electrode 220 and the first overcoat layer 210.

Among the light totally internally reflected at the interface between the transparent electrode 220 and the first overcoat layer 210, the light L4 is extracted to the outside of the substrate 101, and the light L5 has an angle greater than a total reflection critical angle and thus is not extracted to the outside of the substrate 101 and is trapped between the transparent electrode 220 and the first overcoat layer 210. In this case, the light L5 totally internally reflected at the interface between the transparent electrode 220 and the first overcoat layer 210 is extracted to the outside of the substrate 101 through multiple reflections by travelling at an angle smaller than a total reflection critical angle through the air hole 221 of the first overcoat layer 210.

Regarding an arrangement relationship between the holes 221, the air holes 211 and the microlenses 235, the surface of the second overcoat layer 230 has the plurality of concave portions 233 and the plurality of convex portions 231 alternately disposed to form the microlenses 235.

The hole 221 of the transparent electrode 220 and the air hole 211 of the first overcoat layer 210 may be disposed at a region corresponding to the concave portion 233 of the microlens 235.

In this case, a center point of each of the hole 221 and the air hole 211 is located so as to correspond to an apex S of the concave portion 233 of the second overcoat layer 230.

A width d1 of the air hole 211 may be smaller than a width, preferably a maximum width D of the concave portion 233 of the microlens 235. Since the width d1 of the air hole 211 is smaller than the maximum width D of the concave portion 233 of the microlens 235, a light extraction effect may be further improved through the microlens 235.

In this regard, when the width d1 of the air hole 211 is greater than the maximum width D of the concave portion 233 of the microlens 235, a path of light extracted to the outside of the substrate 101 from the microlens 235 may be changed, and thus the light may not be extracted to the outside of the substrate 101 and may be trapped.

In this case, a decrease in light extraction efficiency may happen.

The width d1 of the air hole 211 of the first overcoat layer 210 being greater than a width d2 of the hole 221 of the transparent electrode 220 is illustrated by way of example. Alternatively, the hole 221 of the transparent electrode 220 and the air hole 211 of the first overcoat layer 210 may be formed to have the same width within a limit of the maximum width D of the concave portion 233 of the second overcoat layer 230.

The air holes 211 of the first overcoat layer 210 may be formed by performing patterning through the holes 221 of the transparent electrode 220 by using the transparent electrode 220 as a mask. Thus, the transparent electrode 220 may have a function of extracting light trapped inside the second overcoat layer 230 to the first overcoat layer 210 and a function as a mask for forming the air holes 211 of the first overcoat layer 210.

A process of forming the air holes 211 of the first overcoat layer 210 is briefly described. The first overcoat layer 210, a metal layer (not shown), and the second overcoat layer 230 are sequentially formed on the passivation layer 109c.

Then, the microlenses 235 are formed at the second overcoat layer 230, and then, the metal layer (not shown) is partially wet-etched so as to correspond to the concave portions 233 of the microlenses 235. Thus, holes are formed in the metal layer to form the transparent electrode 220.

Thereafter, the air holes 211 are formed in the first overcoat layer 210 by using the holes 221 of the transparent electrode 220 as openings.

Figure 5:
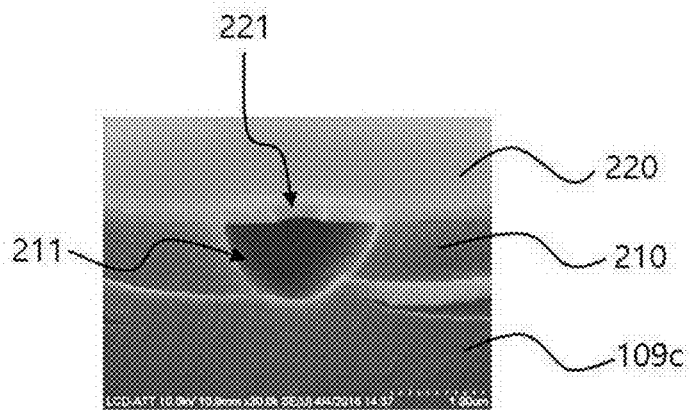
FIG. 5 is a picture showing shapes of a hole and an air hole formed in a first overcoat layer and a transparent electrode according to the first embodiment of the present disclosure.
Figure 6:
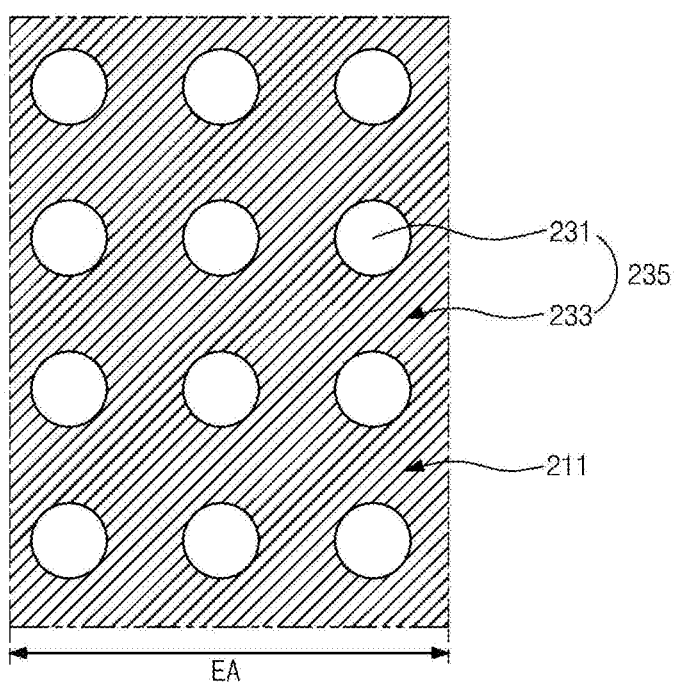
FIG. 6 is a schematic plan view illustrating an arrangement structure of air holes and microlenses of the present disclosure.

FIG. 5 is a picture showing shapes of the hole and the air hole formed in the first overcoat layer and the transparent electrode of the present disclosure. FIG. 6 is a schematic plan view illustrating an arrangement structure of the air holes and the microlenses of the present disclosure.

Referring to FIG. 5, it is shown that the air hole 211 is formed in the first overcoat layer 210 disposed on the passivation layer 109c, and the air hole 211 is formed in the transparent electrode 220 disposed on the first overcoat layer 210 to correspond to the air hole 211.

As shown in FIG. 6, the air hole 211 of the first overcoat layer 210 is disposed to correspond to the concave portion 233 of the microlens 235.

In other words, as shown in FIG. 6, a plurality of microlenses 235 are disposed to correspond to the emission region EA of each pixel region P. The microlenses 235 are formed by alternately forming the plurality of concave portions 233 and the plurality of convex portions 231 disposed adjacent to the concave portions 233 at the surface of the second overcoat layer 230.

The convex portion 231 of the microlens 235 having a circular shape when viewed in a plane is illustrated by way of example. Alternatively, the convex portion 231 may have various overall shapes such as a hexagonal shape, a hemispherical shape, a semielliptic shape, and a quadrangular shape.

In this case, since the air holes 211 formed in the first overcoat layer 210 are disposed to correspond to the concave portions 233 of the microlenses 235, the air holes 211 may be formed in all regions excluding regions in which the convex portions 231 are formed.

Figure 7:
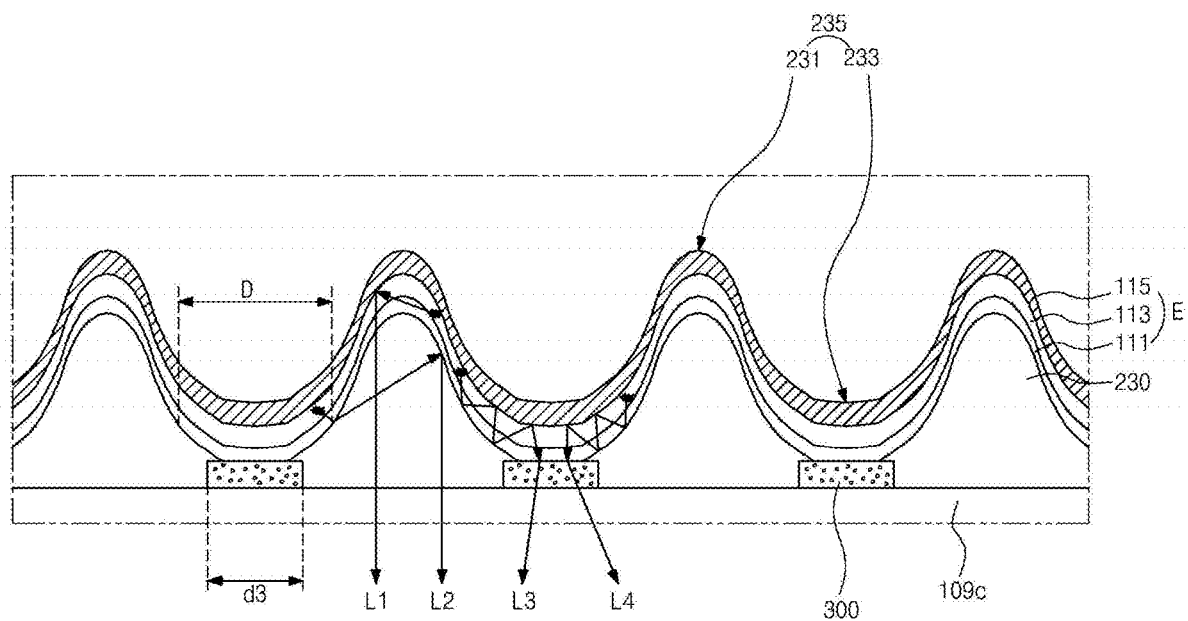
FIG. 7 is a schematic view illustrating a state in which light is guided in an OLED display device according to a second embodiment of the present disclosure.

As described above, in the OLED display device 100 according to the first embodiment of the present disclosure, the first overcoat layer 210 having the plurality of air holes 211 and the transparent electrode 220 are disposed between the passivation layer 109c and the second overcoat layer 230, of which the surface forms the microlenses 235, thereby further improving light extraction efficiency of the OLED display device (100 of FIG. 2). FIG. 7 is a schematic view illustrating a state in which light is guided in an OLED display device according to a second embodiment of the present disclosure.

Referring to FIG. 7, a plurality of scattering patterns 300 and an overcoat layer 230, of which the surface forms the microlens 235, are disposed on a passivation layer 109c corresponding to an emission region (EA of FIG. 2) in one pixel region (P of FIG. 2). An LED E including a first electrode 111, an organic light emitting layer 113, and a second electrode 115 is disposed on the overcoat layer 230.

All of the first electrode 111, the organic light emitting layer 113, and the second electrode 115 are sequentially formed along a surface of the overcoat layer 230.

In this case, the scattering patterns 300 are disposed on the passivation layer 109c and correspond to the respective concave portions 233 of the overcoat layer 230. By the scattering patterns 300, among lights L3 and L4 totally internally reflected at an interface between the first electrode 111 and the overcoat layer 230, some light traveling to the concave portion 233 of the overcoat layer 230 is scattered and thus is extracted to the outside of a substrate (101 of FIG. 2) through multiple reflections.

Accordingly, light extraction efficiency is improved even at the concave portion 233 of the microlens 235.

The scattering patterns 300 may be patterns each including scattering particles and may be formed by dispersing the scattering particles in a binder.

The scattering particles may be particles having a refractive index different from that of the binder. The scattering particle may have a refractive index of about 1.0 to about 3.5, for example, a refractive index of about 1.0 to about 2.0, about 1.2 to about 1.8, about 2.1 to about 3.5, or about 2.2 to about 3.0, and may have an average diameter of about 50 nm to about 20,000 nm or about 100 nm to about 5,000 nm.

The scattering particle may have shapes such as a spherical shape, an elliptical shape, a polyhedral shape, and an amorphous shape, but the shape thereof is not particularly limited.

For example, the scattering particle may include an organic material such as polystyrene or a derivative thereof, an acrylic resin or a derivative thereof, a silicone resin or a derivative thereof, or a novolac resin or a derivative thereof, or an inorganic material such as silica, alumina, titanium oxide, or zirconium oxide.

The scattering particle may be made of one or more of the above materials. Alternatively, the scattering particle may be formed as a particle having a core/shell shape or a hollow shape.

The binder may include, for example, an organic material, an inorganic material, or an organic/inorganic combination material. The organic material may be a thermal or photo-curable monomeric, oligomeric, or polymeric organic material, which is based on polyimide, a cardo resin having a fluorine ring, urethane, an epoxide, a polyester, or an acrylate. The inorganic material may include one of silicon oxide, silicon nitride, silicon oxynitride, or polysiloxane.

The scattering patterns 300 may be formed by coating a material with a wet-coating method, and curing the material with a heat-applying method, light-irradiating method or a sol-gel method. Alternatively, the scattering patterns 300 may be formed by a deposition method such as a chemical vapor deposition (CVD) or physical vapor deposition (PVD) method, or a micro-embossing method.

A width d3 of the scattering pattern 230 may be smaller than a maximum width D of the concave portion 233 of the microlens 235. Since the width d3 of the scattering pattern 300 is smaller than the maximum width D of the concave portion 233 of the microlens 235, the light extraction effect may be further improved through the microlens 235.

As described above, in the OLED display device 100 according to the second embodiment of the present disclosure, since the scattering patterns 300 are formed on the passivation layer 109c so as to correspond to the concave portions 233 of the overcoat layer 230 having the microlenses 235, light extraction efficiency may be improved even at the concave portion 233 of the overcoat layer 230, thereby further improving light extraction efficiency of the OLED display device 100.

It will be apparent to those skilled in the art that various modifications and variation can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. An organic light emitting diode display device, comprising:
    a substrate including a plurality of pixel regions, each of which includes an emission region and a non-emission region around the emission region;
    a plurality of scattering portions disposed on the substrate, corresponding to the emission region, and spaced apart from each other;
    a first overcoat layer disposed on the plurality of scattering portions, and including a plurality of concave portions which respectively correspond to the plurality of scattering portions and a plurality of convex portions which are disposed alternately with the plurality of concave portions to have a surface forming microlenses, wherein the plurality of concave portions of the first overcoat layer respectively overlap the plurality of scattering portions provided below the first overcoat layer, and the plurality of convex portions of the first overcoat layer do not overlap the plurality of scattering portions provided below the first overcoat layer, wherein the plurality of scattering portions are between the substrate and the first overcoat layer;
    a first electrode disposed on the first overcoat layer in each of the plurality of pixel regions; and
    an organic light emitting layer and a second electrode sequentially disposed on the first electrode,
    wherein the plurality of scattering portions include a plurality of air holes, respectively, or a plurality of scattering patterns, respectively,
    wherein the plurality of air holes are formed in a second overcoat layer disposed below the first overcoat layer,
    wherein each of the plurality of scattering patterns includes scattering particles, and
    wherein the plurality of concave portions are each recessed to a downward direction, and the plurality of convex portions are each protruded to an upward direction.

2. The organic light emitting diode display device of claim 1, wherein a transparent electrode is disposed between the first overcoat layer and the second overcoat layer and has a plurality of holes which respectively correspond to the plurality of air holes.

3. The organic light emitting diode display device of claim 2, wherein an air hole in the plurality of air holes and a corresponding hole in the plurality of holes have a same width.

4. The organic light emitting diode display device of claim 2, wherein a center point of an air hole in the plurality of air holes and a corresponding hole in the plurality of holes are located to correspond to an apex of a corresponding concave portion in the plurality of concave portions.

5. The organic light emitting diode display device of claim 2, wherein the transparent electrode is made of a metal oxide of indium tin oxide (ITO) or indium zinc oxide (IZO).

6. The organic light emitting diode display device of claim 1, wherein a width of a scattering portion in the plurality of scattering portions is smaller than a maximum width of a corresponding concave portion in the plurality of concave portions.

7. The organic light emitting diode display device of claim 1, wherein each of the plurality of pixel regions includes a wavelength conversion layer between the plurality of scattering portions and the substrate.

8. The organic light emitting diode display device of claim 7, wherein each of the plurality of pixel regions includes a driving thin film transistor.

9. The organic light emitting diode display device of claim 1, wherein each of the first electrode, the organic light emitting layer and the second electrode has a shape corresponding to a shape of the surface of the first overcoat layer forming microlenses.

10. The organic light emitting diode display device of claim 1, wherein the first overcoat layer includes a plurality of open holes respectively exposing the plurality of scattering patterns, and wherein the first electrode includes a plurality of portions which contact the plurality of scattering patterns through the plurality of open holes, respectively.

11. The organic light emitting diode display device of claim 1, wherein each of the plurality of scattering patterns has a flat top surface.

12. The organic light emitting diode display device of claim 1, wherein the plurality of concave portions are located closer to the substrate than the plurality of convex portions are.

13. The organic light emitting diode display device of claim 1, wherein the scattering pattern is disposed at a region corresponding to the concave portion of the first overcoat layer.

* * * * *